(12) United States Patent
Takeo

(10) Patent No.: US 6,838,361 B2
(45) Date of Patent: Jan. 4, 2005

(54) METHOD OF PATTERNING A SUBSTRATE

(75) Inventor: Kawase Takeo, Cambridge (GB)

(73) Assignee: Seiko Epson Corporation, Tokyo (JP)

( * ) Notice: Subject to any disclaimer, the term of this patent is extended or adjusted under 35 U.S.C. 154(b) by 0 days.

(21) Appl. No.: 10/275,318

(22) PCT Filed: Mar. 11, 2002

(86) PCT No.: PCT/GB02/01118
§ 371 (c)(1),
(2), (4) Date: Jan. 29, 2003

(87) PCT Pub. No.: WO02/073712
PCT Pub. Date: Sep. 19, 2002

(65) Prior Publication Data
US 2004/0029382 A1 Feb. 12, 2004

(30) Foreign Application Priority Data
Mar. 9, 2001 (GB) .............................. 0105876

(51) Int. Cl.⁷ .......................... H01L 21/20; H01L 21/36
(52) U.S. Cl. ..................... 438/493; 438/151; 438/479
(58) Field of Search .............................. 438/151, 479, 438/493

(56) References Cited
U.S. PATENT DOCUMENTS
6,087,196 A * 7/2000 Sturm et al. ................ 438/29

FOREIGN PATENT DOCUMENTS
EP 0 989 778 A1 3/2000
WO WO 99/39373 8/1999

OTHER PUBLICATIONS

Kawase, T., et al., "All–Polymer Thin Film Transistors Fabbricated by High–Resolution Ink–jet Printing", Dec. 10–13, 2000, IEDM 2000, pp. 623–626.*
Sirringhaus et al., "High–Resolution Inkjet Printing of All––Polymer Transistor Circuits", SCIENCE, vol. 290, No. 5499, pp. 2123–2126, Dec., 2000.

* cited by examiner

Primary Examiner—Howard Weiss
(74) Attorney, Agent, or Firm—Oliff & Berridge, PLC

(57) ABSTRACT

The invention provides a method of pattering a substrate, in which a first material in solution is deposited on the substrate. The composition of the solution of the first material is selected so it dries to leave a residue of the first material on the substrate, the residue comprising a thin film in the centre and a ridge around the perimeter. The residue is etched to remove the thin film, leaving the ridge on the substrate. After etching the ridge is hydrophobic and the substrate is hydrophilic. An aqueous solution of a second material is then deposited on both sides of the ridge. After the aqueous solution has dried, the ridge is removed, leaving a layer of the second material on the substrate, the layer having a narrow gap therethrough. The layer may be used for the source and drain electrodes of an organic thin film transistor.

52 Claims, 14 Drawing Sheets

Shrink type

Mesa type

Ring type

Self-alignment with large wettability contrast

S: source electrode
D: drain electrode
G: gate electrode

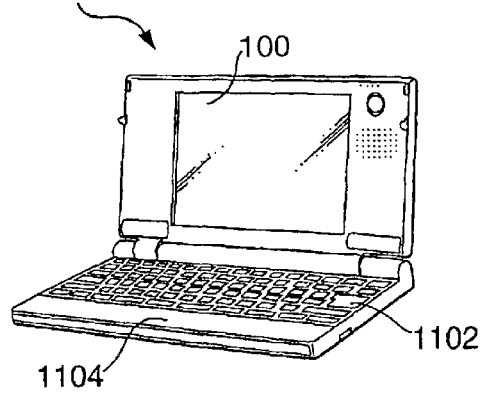
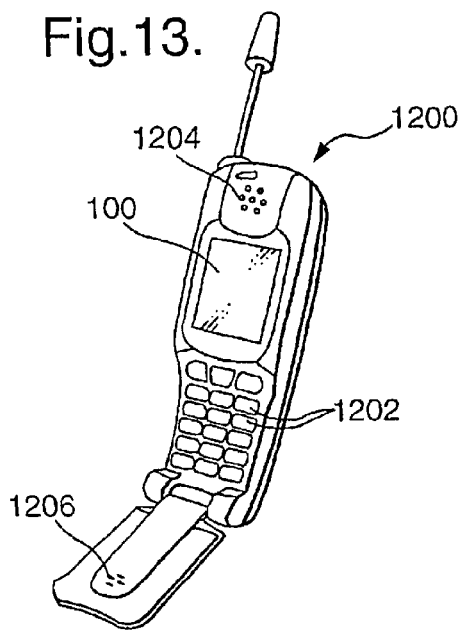
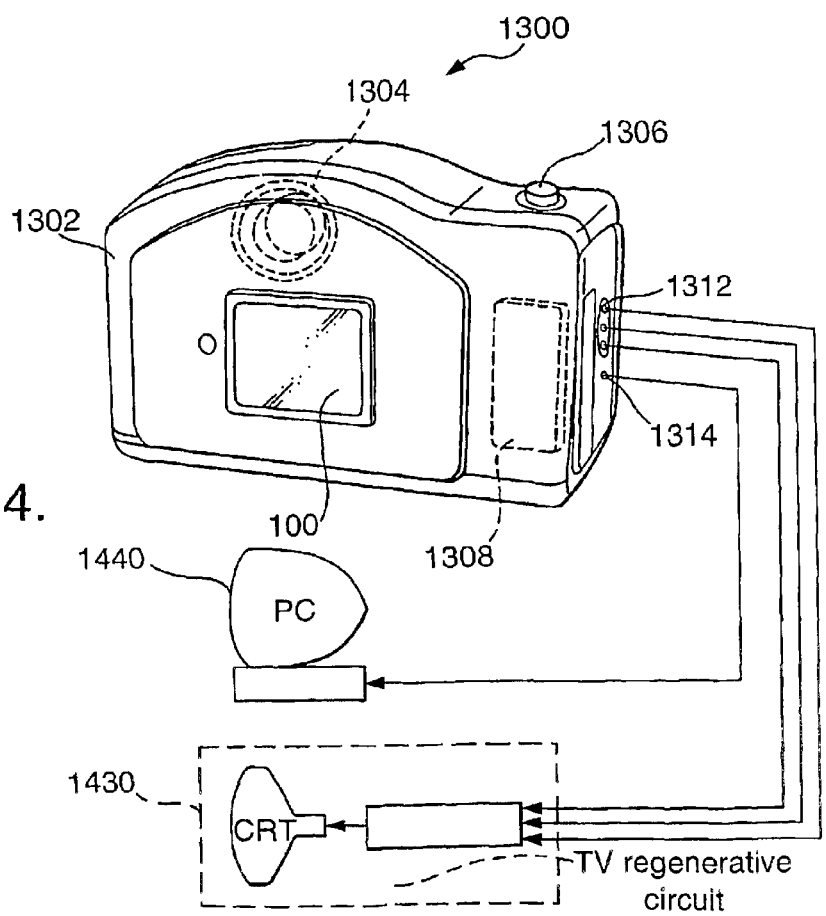

METHOD OF PATTERNING A SUBSTRATE

BACKGROUND OF THE INVENTION

1. Field of Invention

The present invention relates to a method of patterning a substrate. In particular, the method of the present invention relates to patterning substrates to provide electronic devices such as thin film transistors (TFTs) and/or electro-optic devices thereon.

2. Description of Related Art

Photolithography is presently widely used for the mass production of electronic devices and achieves very high resolution and registration. In photolithography, a spin-coated photoresist layer is provided on a substrate and is exposed by blue or ultraviolet light with an aligner or stepper, which aligns patterns on a master, comprising a mask or reticule, with the substrate. The exposed photoresist is then developed to provide patterns of the photoresist on the substrate. This is generally followed by an etching or deposition process to pattern an objective material. The resolution achieved by photolithography is determined by the wavelength of the exposure light and the optics of the aligner or stepper.

Presently, this photolithographic technique is used not only for small-sized integrated circuits but also for very large active-matrix displays. For example, thin film transistor (TFT) arrays for active-matrix liquid crystal display (LCD) panels require substrates larger than 50 cm$^2$. Particularly high resolution and registration are required for producing arrays of TFTs in LCD panels, since the channel lengths of the TFTs should ideally be lower than 20 $\mu$m. However, it has been found that such large substrates tend to exhibit bending, presenting difficulties in providing sufficiently accurate resolution and registration. Furthermore, the photolithographic process must be performed several times to make a complete device and this presents further difficulties in repeating registration with sufficient accuracy. However, manufacturers usually use a single aligner, having sufficiently high resolution and very precise registration mechanism, not only for the formation of channels but also for the other patterning steps. Such an alignment system is expensive. Moreover, processes using such an aligner are also expensive, thereby raising the manufacturing cost of LCD panels.

In order to reduce the cost entailed by the use of photolithography, a variety of non-photolithographic patterning processes have been proposed. For example, micro-contact printing and micro-moulding techniques have been found to be capable of patterning feature sizes down to 1 $\mu$m. These techniques use elastic rubber stamps for printing so as to provide good contact between the stamp and a substrate. Due to its elasticity, however, the stamp becomes distorted, which makes it difficult to align the master stamp with the patterns on a substrate. Thus, these techniques have the significant disadvantage of difficulties in accurate registration, especially with large substrates, such as those used for LCD panels.

Inkjet printing technology is now used widely for personal printing. It achieves a very high quality of print, approaching photographic grade. Inkjet printing has also proved to be a promising technique for manufacturing electronic devices such as colour filters for liquid crystal displays and full-colour electroluminescent displays. To achieve such electroluminescent displays, different conjugated polymers are deposited using an inkjet printing technique to provide three colours (blue, green, and red) in the display.

Inkjet techniques had previously been regarded as being comparatively low-resolution patterning techniques and it had therefore previously been thought that inkjet printing was unsuitable for producing TFTs. This is because organic polymer TFTs require a channel length of less than 20 $\mu$m to achieve a sufficiently high drain current. To produce such a TFT using an inkjet technique, source, drain and gate electrodes must be printed on a substrate. The source and drain electrodes must have a very small gap between them, since this gap defines the channel in the TFT. Since polymer semiconductors have low carrier mobility, this gap should be less than 20 $\mu$m, as noted above, in order to achieve practical characteristics.

However, the resolution presently achieved simply by inkjet printing on a solid substrate is not sufficiently high to pattern the source and drain electrodes with a suitably small gap therebetween (channel length), due to fluctuations in the printing process. In particular, the direction of flight of ink droplets is not always completely perpendicular to the face of the nozzle plate of the inkjet print head from which they are ejected, resulting in patterning errors. Furthermore, an ejected droplet spreads on the surface of the substrate onto which it is ejected. The amount the droplet spreads is a function of the surface energies and the interfacial energy of the solid substrate and of the liquid droplet respectively. However, there are fluctuations in the surface energy and the interfacial energy of the solid surface. This results in variations in size of respective droplets deposited on the substrate. Accordingly, the width of the gap between two deposited droplets and hence the channel length of a printed TFT is variable and, in the worst case, short circuits are formed between the source and drain electrodes.

Nonetheless, all-polymer TFTs have previously been fabricated by inkjet deposition. In such fabrication, the source, drain and gate electrodes are formed of a conducting polymer, PEDOT (poly-ethylenedioxythiophene, Baytron P from Bayer AG), and deposited using an inkjet technique. In order to obtain a satisfactory channel width, inkjet printing can be combined with the pre-patterning of wetting properties. This allows control of the flow of ink on the substrate by using a pattern of hydrophilic and hydrophobic substrate regions. As shown in FIG. 8(b), a non-wetting or hydrophobic repelling strip 102 of polyimide (PI) can first be formed on a glass substrate 100 by photolithography, micro-contact printing, micro-moulding printing or photo-induced wettability patterning. This repelling strip 102 defines the channel 106 of the TFT, the width of the strip 102 being the length L of the channel 106, as shown in FIG. 8(a). The remaining area of the substrate 100 is hydrophilic or wetting with respect to a solution of PEDOT. Source and drain electrodes can then be formed by depositing a water-based solution of PEDOT onto the glass substrate using an inkjet print head. The PEDOT solution exhibits relatively high contact angles of around 70° on the PI strip, and small contact angles of less than 20° on the glass region. Thus, when droplets 104 of PEDOT solution are deposited along the strip 102, the droplets 104 spread over the substrate 100 but are repelled by the strip 102. The solution 104 on the substrate 100 is therefore confined from spreading over the repelling strip 102, but instead aligns along the side of the strip 102. Using this self-aligning mechanism, source 108 and drain 110 electrodes with a channel length L shorter than 20 $\mu$m and as low as 5 $\mu$m can be achieved.

SUMMARY OF THE INVENTION

In practice, photolithography has previously been used to form the PI strip. However, the use of lithography entails many steps including the application of a primer, coating of a photoresist, mask-alignment, exposure, baking, development, etching and stripping. The use of lithography therefore significantly increases process costs and outweighs the benefits of inkjet printing. Micro-contact printing and micro-moulding printing with an elastic stamp (mould), for example made of PDMS (polydimethylsiloxane) could also be used for pre-patterning, but the distortion and deformation of the elastic stamp discussed above deteriorates accuracy in registration. As an alternative, the recently developed method of photo-induced wettability patterning appears promising since it can be expected to involve a smaller number of steps than lithography. However, this method has not yet been properly established. In particular, in the current state of the art of this method, the wavelength of the light is too short and the sensitivity of the method is too low for realistic application.

Thus, there is no suitable technique for consistently providing sufficiently small channel lengths in a cost effective manner.

According to a first aspect of the present invention, there is provided a method of patterning a substrate, the method comprising:

depositing a first material in solution on the substrate, wherein the solution of the first material is selected such that a profile of the first material dried on the substrate includes a ridge;

etching for removing portions of the first material such that the ridge of the first material remains on the substrate; and depositing a second material in solution on or adjacent the ridge of the first material.

Embodiments of the present invention will now be described by way of further example only and with reference to the accompanying drawings, in which:

BRIEF DESCRIPTION OF THE DRAWINGS

FIG. 12 shows a schematic view of a mobile personal computer incorporating a display and other devices fabricated in accordance with the present invention;

FIG. 13 shows a schematic view of a mobile telephone incorporating a display and other devices fabricated in accordance with the present invention; and FIG. 14 shows a schematic view of a digital camera incorporating a display and other devices fabricated in accordance with the present invention.

DETAILED DESCRIPTION OF EXEMPLARY EMBODIMENTS

Figure 1A:
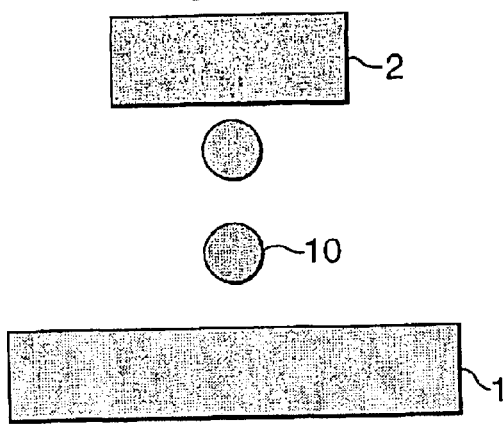
FIG. 1 illustrates a method for patterning a substrate in accordance with the present invention.

The present invention provides a high-resolution patterning technique that does not require photolithography or similar processes. Briefly, in one aspect of the present invention pre-patterning is formed with a first material, which is deposited on a substrate in the form of droplets of a solution of the first material such as, for example, an organic polymer dissolved in a solvent. The use of an inkjet print head has been found to be suitable for this purpose. Droplets deposited on the substrate spread, the degree of spreading being determined by the parameters discussed above. However, the solution comprising the first material is formulated such that the perimeter of a deposited droplet remains constant with respect to the substrate as solvent evaporates and the droplet dries to leave a residue of the first material. This will be termed hereafter pinned contact line deposition and will be explained in more detail below. The pinned contact line deposition results in ring-shaped deposition of the first material, in which most of the solute in the droplet gathers on the contact line and is deposited there. Thus, the dried residue of the first material comprises a ridge disposed around the edge and a thin film in the centre region. The ridge has a narrow width compared with the diameter of the droplet and this width can be controlled. The width of the ridge can be controlled by the viscosity of the solution or by the drying speed of the solution. The viscosity of the solution is changed by the concentration of organic polymer material in solution. Therefore the width of the ridge can be controlled by controlling the concentration of the organic polymer solution. The viscosity of the solution, of course, depends additionally on the viscosity of the solvent. As will become apparent from the description below, a relatively low concentration and therefore relatively thin solution will give rise to a relatively narrow ridge and this characteristic can be used to advantage in the method of the present invention. Such a narrow ridge is also obtained by using low viscosity solvent. Furthermore, a narrow ridge can be achieved if the solution is dried relatively quickly by using a volatile solvent, by providing a gas flow over the solution, which may be a heated gas flow, or by heating the substrate onto which a droplet has been deposited. Naturally, any combination of the above techniques may be used to control the drying speed and/or the viscosity of the solution.

This deposition step is followed by wet or dry etching in order to remove the thin film in the centre region and to leave a narrow ridge on the substrate. The width of the ridge can be further controlled by the etching process since the cross-sectional shape of the ridge is substantially triangular. A second material in solution is then deposited in the form of droplets along either side of the ridge. Again, the use of an inkjet print head has been found suitable for this purpose. The substrate or underlying structure is wetting with respect to the solution of the second material and the ridge of the first material is non-wetting with respect to the solution of the second material, that is, it repels the solution of the second material. As a result, each droplet of the solution of the second material aligns itself along a respective side of the ridge and dries to form a layer of the second material along that respective side.

Finally, the deposition process of the second material can be followed by a process of removing the ridge of the first material. To accomplish this, the substrate can be dipped in a solvent for dissolving the first material only. This leaves a layer of the second material on the substrate formed in two portions, having a narrow gap therebetween. The gap is defined by the width of the ridge of the first material.

This process can be applied to form a channel for a TFT, which requires a narrow gap between a source and a drain. The channel length can be controlled by appropriately selecting the concentration of the first material in solution, the drying conditions of the first material in solution and the conditions of the etching process. A channel length of the order 5 μm can be achieved using the above-mentioned patterning method.

Various aspects of the present invention will now be explained in more detail. FIG. 1 shows the process flow of a patterning method according to the present invention. A solution of a first organic or inorganic material is deposited on to a substrate 1 in the form of a droplet 10 as shown in FIG. 1(a). The function of the first organic or inorganic material is to provide on the substrate 1 a pre-pattern which has a particular wetting characteristic with respect to a solution of a second target material deposited at a later stage. The first pre-patterning material should have different wetting properties from the substrate 1 with respect to the solution of the second target material.

When a pattern of the second material is required to be formed with a small gap therein, the first pre-patterning material should be more repelling with respect to the solution of the second material than the substrate. When a pattern of the second material is required to form a narrow line, the first pre-patterning material should be more wetting than substrate with respect to the solution of the second material. For ease of explanation, the subsequent description will be primarily directed to the case where a pattern of the second material is required to be formed with a small gap therein. However, this should not be treated as limiting the scope of the present invention.

Thus, where the second material is PEDOT and the solution thereof is an aqueous solution, a hydrophobic material can be used as the first pre-patterning material. For example, polystyrene is typical hydrophobic material. However, all chemicals and polymers consisting of non-polar groups show hydrophobic properties and are suited for use as the first pre-patterning material when a solution of the second target material in a polar solvent is used. In order to achieve a large contrast in the wettability between the first material and the substrate with respect to the solution of the second material, the substrate 1 should be hydrophilic, thereby providing a wetting surface with respect to the polar solvent. To provide this hydrophilic surface, the substrate 1 may, for example, be exposed to $O_2$ plasma prior to deposition of the first pre-patterning material.

Figure 1F:
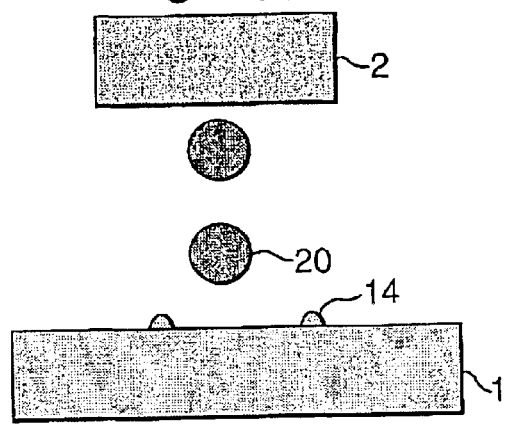
Figure 1B:
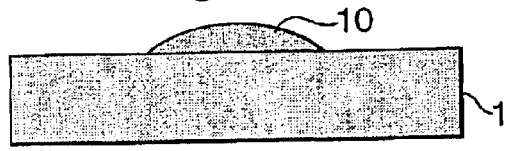
Figure 1G:
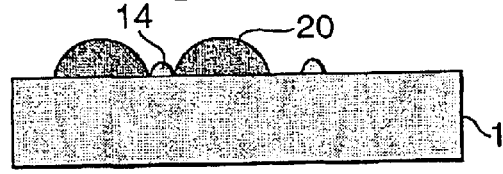

The deposited droplet 10 of the solution of the first pre-patterning material spreads over the substrate 1 and has a diameter determined by the surface tension (surface free energy density) of the droplet 10 and the substrate 1 respectively and the interfacial tension (interface free energy density) between the droplet 10 and the substrate 1, as shown in FIG. 1(b). In the case that a non-polar material is chosen for the first material and for the solvent for the first material, the surface tension of the solution is in general small (about 20~30 mJ/m$^2$). This results in a small contact angle between the upper surface of the droplet 10 and the surface of the substrate 1, and a large diameter of the droplet 10 on the substrate 1. This contact angle is smaller than 30°.

Figure 1C:
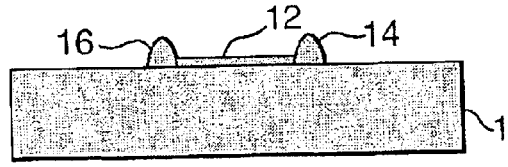
Figure 1H:
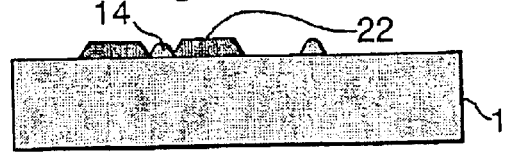
Figure 2A:
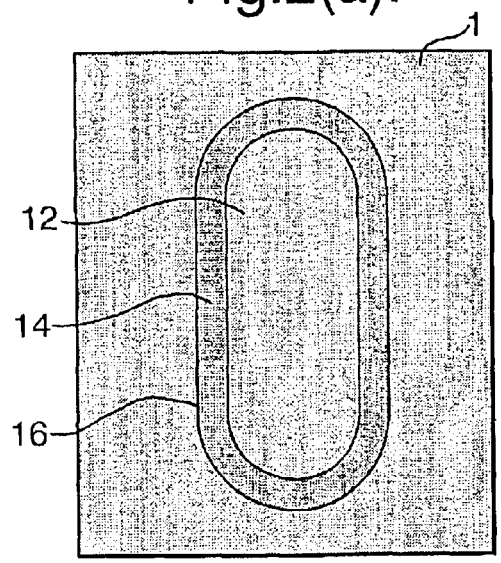
FIG. 2 shows plan views of a substrate during patterning using the method illustrated in FIG. 1.
Figure 2C:
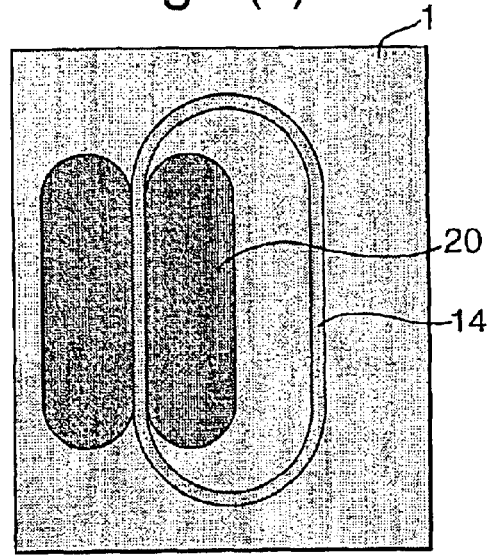

After the solvent in the droplet 10 has evaporated, the cross-sectional profile of the residue 16 of the first material deposited on the substrate is unexpected. This profile is not a hemispheric profile as may be expected, but a ring-shaped profile, as shown in FIGS. 1(c) and 2(a), in which most of the first material is deposited on the edge and a small amount of the first material is deposited in the centre region. In other words, a ridge 14 is formed around the perimeter and a thin layer 12 is formed in the centre region. As will be discussed in greater detail, a small contact angle is preferable to obtain a significant ridge 14 disposed around the perimeter of the dried droplet 10.

Where only one droplet 10 is deposited on the substrate 1, the ridge 14 is substantially circular. However, if multiple droplets 10 are deposited with relative displacement between the substrate 1 and a dispenser for the droplets 10, such as an inkjet print head 2, an elongated circle such as that shown FIG. 2(a) may be obtained.

Figure 1D:
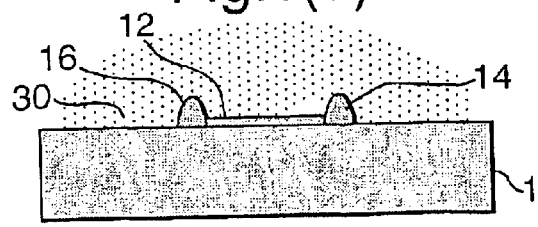
Figure 1I:
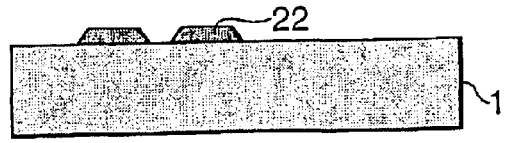

Since the dried droplet 16 includes a thin film 12 in the centre region, the wettability of the dried droplet 16 with respect to the solution of the second material is constant over the whole area of dried droplet 16 of the first pre-patterning material. However, the dried droplet 16 of the first pre-patterning material is then etched using a dry or wet etching process, as shown in FIG. 1(d), to remove the thin film 12 in the centre region.

It should be noted that the chemical properties of the etchant 30 selected for use in this etching process can noticeably affect the wetting properties of both the substrate 1 and the dried droplet 16 of the first pre-patterning material. Thus, many variations in this etching process are possible. However, to take a simple example, dry etching may be performed with a plasma of inert gas such as helium, neon, argon, krypton, xenon or nitrogen. The wettability of the substrate 1 and of the dried droplet 16 respectively is unaffected by etching with the plasma of inert gas. Thus, if the substrate 1 initially has a wetting surface and the dried droplet 16 of the first pre-patterning material initially has a repelling surface with respect to the solution of the second material, these properties are retained after this etching process.

Figure 1E:
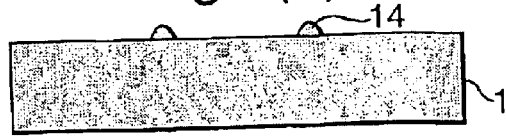
Figure 2B:
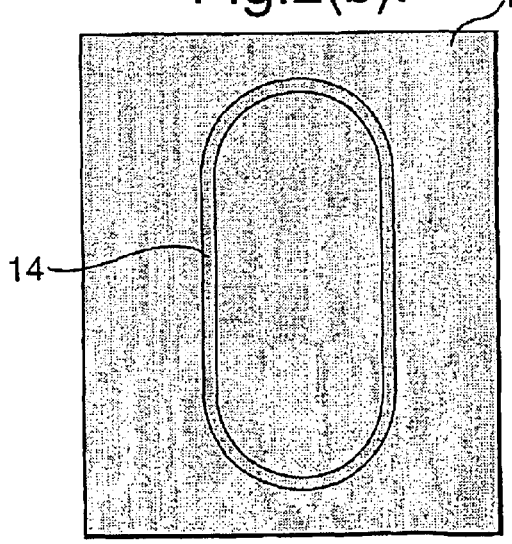
Figure 2D:
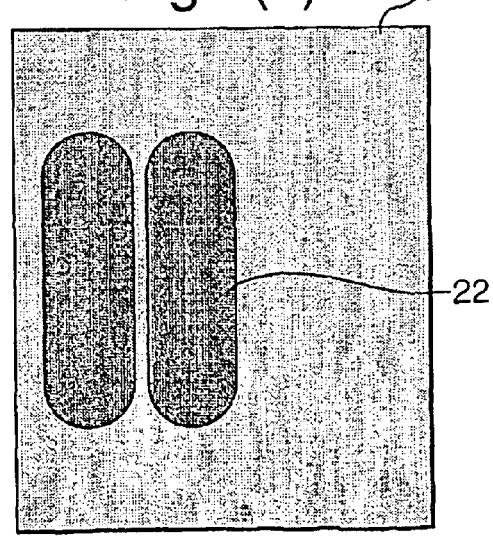

The parameters of the etching process, including the etching time, power density and density of active molecules, are determined so as to obtain a complete removal of the thin film 12 in the centre region of the dried droplet 16 but to retain a partially etched portion of the ridge 14 on the substrate 1, as shown in FIGS. 1(e) and 2(b). Thus, the entire surface of the substrate 1 is exposed except for the remaining narrow ridge 14, which provides a repelling surface. Thus, a contrasting pattern in wettability, comprising the narrow non-wetting ridge 14 on the wetting surface of the substrate 1, is defined.

The width of the ridge 14 can be controlled by the deposition conditions for the solution for the first pre-patterning material, as will explained below. However, the parameters selected for etching, including choice of the etchant 30, also affect the width of the ridge 14. For example, the width of the ridge 14 becomes narrower as etching time increases. Thus, it is possible to consistently achieve lines narrower than 5 μm by optimisation of the deposition conditions and the etching parameters.

After this etching process, the second target material in solution is deposited along the ridge 14 in the form of one or more second droplets 20, as shown in FIG. 1(f), for example using an inkjet print head 2. The second droplets 20 land on the substrate 1 and spread on the substrate 1 up to the edge of the ridge 14 of the first pre-patterning material. The solution of the second material is confined in the wetting region, on the exposed substrate 1, because the narrow ridge 14 repels the solution. Thus, the contrast in wettability between the substrate 1 and the ridge 14 enables alignment of the solution of the second material along the edge of the ridge 14. When droplets 20 of the solution of the second material are formed on both sides of the ridge 14, a narrow gap is formed between them, as shown in FIGS. 1(*g*) and 2(*c*).

As shown in FIG. 2(*c*), in this example the ridge 14 is formed as an elongated circle and only one portion of the ridge 14 is used for pre-patterning. This is suitable for forming the source and drain electrodes of a TFT having a short channel length. However, it will be apparent to those skilled in the art that ridges of differing shapes can be obtained and that other portions or the whole of the ridge 14 can be selected for pre-patterning, depending on the intended application of the present invention.

Upon drying, the second droplets 20 form spaced apart layers 22 of the second target material. Spaced apart layers 22 of the second target material, each having a mesa-shaped cross-sectional profile after drying, as shown in FIG. 1(*h*), can be obtained by appropriate selection of, for example, the concentration of the solution of the second material, as will be discussed in more detail below. As shown in the Figure, there is a narrow gap between the two layers 22, which cannot be consistently achieved using conventional inkjet techniques due to the variations discussed above. However, a consistent, narrow gap can be obtained with the method of the present invention. Moreover, no lithographic techniques are required. The method of the present invention can therefore be used at low cost and is suitable for use with large substrates, for which lithographic patterning is particularly expensive.

Further, the ridge 14 can be removed, for example by bathing the substrate 1 in a solvent for the first pre-patterning material. The second target material is not adversely affected by such a stripping process since it is insoluble in the solvent for the first material. FIGS. 1(*i*) and 2(*d*) show a complete pattern of the second target material after removal of the ridge 14.

Figure 3A:
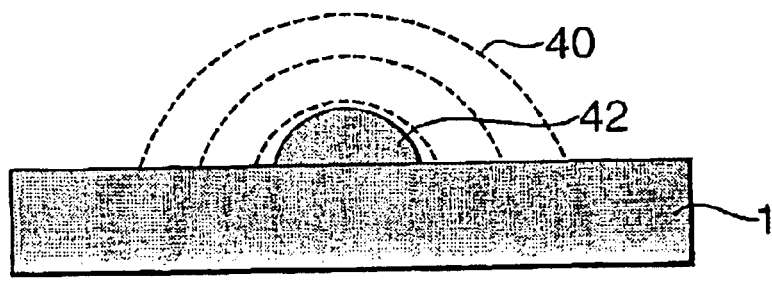
FIG. 3 shows cross-sections of material deposited in solution on a substrate and subsequently dried.
Figure 3B:
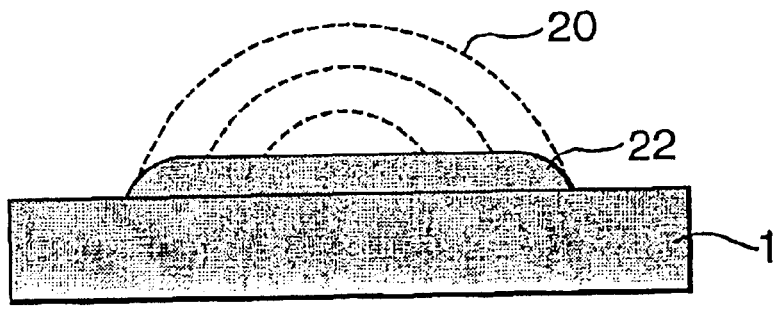
Figure 3C:
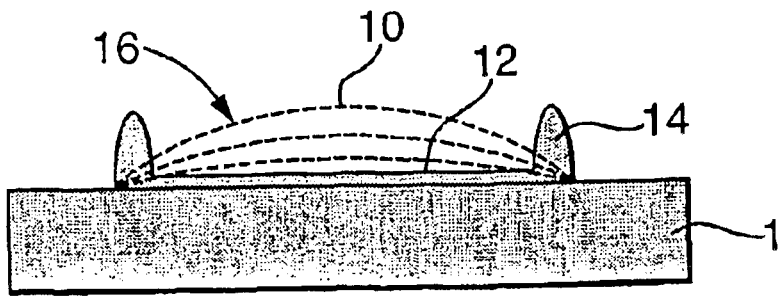

The shape of a dried droplet 16 of the first pre-patterning material and of a layer 22 of the second target material is affected by a number of factors, including the properties of the solutions of the respective materials and the drying conditions, as will now be explained. When a droplet is deposited on a substrate, there are at least three deposition modes, as shown in FIG. 3, each of which results in a different cross-sectional profile of the remaining film of solute on the substrate after the solvent has evaporated. The first deposition mode may be termed shrink type deposition and is shown in FIG. 3(*a*). In this mode, the lateral size or diameter of the deposited film 42 of solute after drying is smaller than the diameter of liquid droplet 40 of solution when first deposited on the substrate, the outline of which is shown as the outermost dotted line. This means the droplet 40 has shrunk during drying. Shrink type deposition occurs when the contact angle of a droplet 40 is relatively large (for example, greater than 40°) and when the solution does not wet the surface of the substrate well. The deposition of a droplet of an aqueous solution onto a hydrophobic surface is an example of shrink type deposition, because of the large contact angle of the droplet with the surface and the non-wetting properties of water on the surface. Thus, when a water-based PEDOT solution is deposited onto a polystyrene film, this shrink type deposition is observed.

The second mode is mesa type deposition, which is used for deposition of the second target material in the present example and is shown in FIG. 3(*b*). In this mode, a small amount of shrinkage of a droplet 20 during drying can also be observed. However, in contrast with shrink type deposition, deposition of the solute occurs during shrinking. As a result, the deposited film 22 has a mesa-shaped profile and a diameter almost the same size as the initial diameter of the droplet 20 of solution. Mesa type deposition occurs when the surface tension of the solution is high (for example, greater than 30 mJ/m$^2$) and when the solution can wet the surface of the substrate. Mesa type deposition may occur when an aqueous solution is deposited onto a hydrophilic surface or an inorganic substrate, since water has a high surface tension and good wetting properties with respect to a hydrophilic surface. When a water-based PEDOT solution is deposited onto a glass substrate, for example, mesa type deposition may be observed.

The last mode is ring type deposition, which is used for deposition of the first pre-patterning material in the present example and is shown in FIG. 3(*c*). The film resulting from this type of deposition may be equated with the film of residue left after coffee is spilt on a solid surface. In ring type deposition, as discussed above, most of the solute is deposited at the edge of the droplet 10, thereby providing a ridge 14 of the solute around the edge and a thin film 12 of the solute in the centre region. Ring type deposition occurs when the contact angle is relatively small (for example, less than 30° and preferably less than 20°) and when wetting of the solution on the substrate is fairly good. In this case, the contact line of the droplet on the substrate is pinned and does not move during drying. This means the contact angle decreases as the droplet 10 dries. This can occur when the surface tension of the solution is low (for example, less than 30 mJ/m$^2$).

Figure 4:
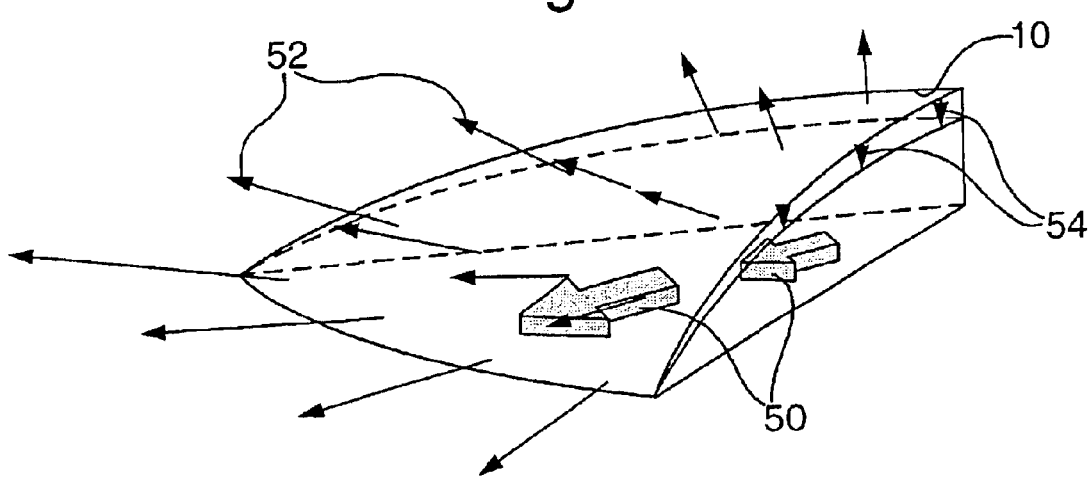
FIG. 4 illustrates fluid flow within a droplet of a solution as the solvent evaporates.

An internal fluid flow 50 is caused in the pinned droplet 10 by enhanced evaporation and volume effects 52 and 54 respectively, as illustrated schematically in FIG. 4. The enhanced evaporation effect 52 is caused by a difference in the speed of evaporation of the solvent at the edge and centre regions of the droplet 10 respectively. A higher evaporation rate is observed in the edge region than in the centre region because solvent molecules escape more easily from the edge region. An internal flow 50 of fluid within the droplet 10 takes place so as to compensate this difference. However, since the contact line is pinned and the volume of the droplet is decreasing, the shape of the droplet changes. Thus, the volume change in the edge region is smaller than that in the centre region, as shown in FIG. 3(*c*) or FIG. 4. This difference in the change of volume at the edge and centre regions respectively also causes internal flow. Accordingly, due to these two effects, an internal flow from the centre to the edge occurs in a droplet drying on a substrate in the ring type deposition mode. The viscosity of the fluid has an influencing effect on the internal flow. Therefore, an efficient (fast) flow occurs in a droplet of low viscosity fluid. When the viscosity of the fluid (solution) is less than about 10 cps, a narrow ridge is obtained. Viscosity of lower than about 4 cps is especially suitable to form a narrow ridge. The viscosity of the solution depends on the concentration of the solute (solid contents), the viscosity of solvent or temperature. If the concentration of the solute (organic polymer) in the solution is reduced, this results in lower concentration and hence an increase in the velocity of internal flow from the centre to the edge of a drying droplet. The use of low viscosity solvent leads to such an increase in the internal flow as well, which results in a narrow ridge (edge). When polymer is used as the solute, the molecular weight of the polymer and the conformation of the polymer in the solution affect the viscosity of the solution. In order to obtain low viscosity, a molecular weight of less than about 100,000 is preferable.

Furthermore, the drying speed of the solution is an important parameter, because the speed of the internal flow is determined by the drying speed. If the solution is dried faster, this results in an increase in the velocity of the internal flow and hence the narrowing of the ridge. The drying speed is enhanced by using a volatile solvent, by providing a gas flow (which may be heated) over the solution, or by heating the solution droplet. When the process is carried out at a room temperature, the boiling point of the solvent is preferably lower than about 160° C. and more preferably lower than about 120° C. to obtain high drying speed. Heating the solution droplet is especially effective to obtain a narrow ridge, because it is effective in two ways: the enhancement of the drying speed and the lowering of viscosity. For this purpose, the droplets of the solution can be deposited on a substrate which is heated from about 40° C. to about 150° C.

This internal flow 50 carries solute in the solution from the centre to the edge. As a result, there is an enhanced deposition of the solute in the edge region and a thin layer is formed in the centre region. The velocity of the flow 50 affects the cross sectional profile of the film and depends on the contact angle, the evaporation speed and the viscosity of the sessile droplet. The velocity of the flow 50 increases with decreasing of a contact angle, so a contact angle of less than 30° is desirable to achieve a ridge 14 having a narrow width. An increased evaporation speed also increases the velocity of the flow 50, so a high evaporation speed narrows the ridge width. The ridge width can therefore be controlled by controlling the concentration of the organic polymer in the deposited solution. The evaporation speed and hence internal flow can also be increased by using a low boiling point solvent, by raising the temperature during drying and by lowering solvent vapour pressure around the droplet. A stream of gas (for example, dry air, nitrogen or argon) passed over a substrate effectively lowers this pressure, resulting in narrowing of the ridge 14. When there is a uni-directional gas flow over the substrate, this causes asymmetric deposition at the edge region. Since the gas upstream is clean, the solvent vapour pressure is lower upstream than downstream, internal flow 50 in the droplet 10 is asymmetric and a larger amount of deposition occurs at the upstream edge than at the downstream edge. This phenomenon is also useful for controlling the height and the width of the ridge 14 and especially for obtaining a high and narrow ridge 14.

The viscosity of the solution also plays an important role. If the solution were to have zero viscosity, all the solute would be carried to the edge due to the very high velocity of internal flow 50 at the final stage of drying. In fact, the viscosity increases as drying proceeds due to an increase in the concentration of the solution. This increase of viscosity lowers the speed of internal flow 50 and eventually stops it. This behaviour determines the thickness of the film 12 at the centre region and the height and the width of the ridge 14. When a thin solution having a low viscosity is used, a very thin film 12 is obtained at the centre region and high and narrow ridge 14 is obtained at the edge. As described above, the viscosity depends not only on the concentration of the solution but also on the combination of solute and solvent and the molecular weight of the solute. These parameters can be optimised so as to obtain low viscosity even after drying has progressed. In general, however, a solution having a viscosity lower than about 4 cps is preferable and a solution having a viscosity lower than 2 cps is more preferable still. When polymers are used for the solute, such viscosities can generally be attained with concentrations less than about 3% or, preferably, 1%.

Dry etching with the plasma of an inert gas has been previously explained, but other etching techniques, having various other effects, may also be used.

Firstly, dry etching may be performed using oxygen plasma, which has the effect of providing a surface with wetting properties, especially with respect to polar solutions. In other words, the surface of both the substrate 1 and the ridge 14 may be turned hydrophilic by dry etching using oxygen plasma. This is due to the oxidation of the surface or the termination of molecules at the surface by hydroxyl groups formed by a reaction of radical oxygen molecules on the surface and water molecules in air. Since the polarity of oxygen or a hydroxyl group may induce hydrophilic properties in the surface of both the substrate 1 and the ridge 14, the wettability contrast between the ridge and the substrate is lost by oxygen plasma etching for many combinations of substrate material and first pre-patterning material.

Figure 5A:
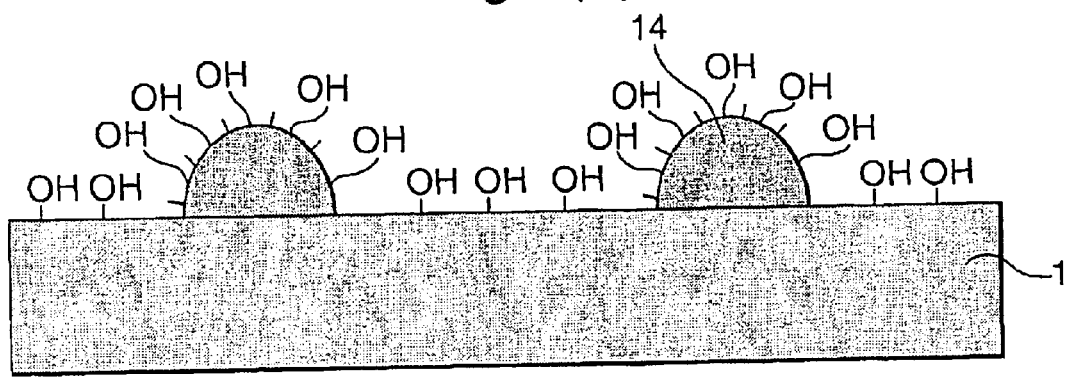
FIG. 5 shows etching of a substrate in accordance with the present invention.

FIG. 5(a) shows the case where the surface of both the ridge 14 and the substrate 1 are terminated with hydroxyl groups (—OH) and therefore both have hydrophilic properties, irrespective of whether either the substrate or the first unetched pre-patterning material was originally hydrophobic. However, it has been found that the region modified by oxygen plasma remains at the surface and that the original contrast in wettability can be recovered by eliminating the surface region of either the ridge of the substrate. In this example, the surface of the first pre-patterned material, that is, the ridge 14, is removed. This can be achieved by etching.

As discussed above, non-polar polymers are suitable for use as the first pre-patterning material where the second target material is PEDOT deposited in a water-based solution. Such non-polar polymers include polymers consisting of aromatic groups and alkyl groups. For example, polystyrene and polyethylene are typical non-polar polymers.

Figure 5B:
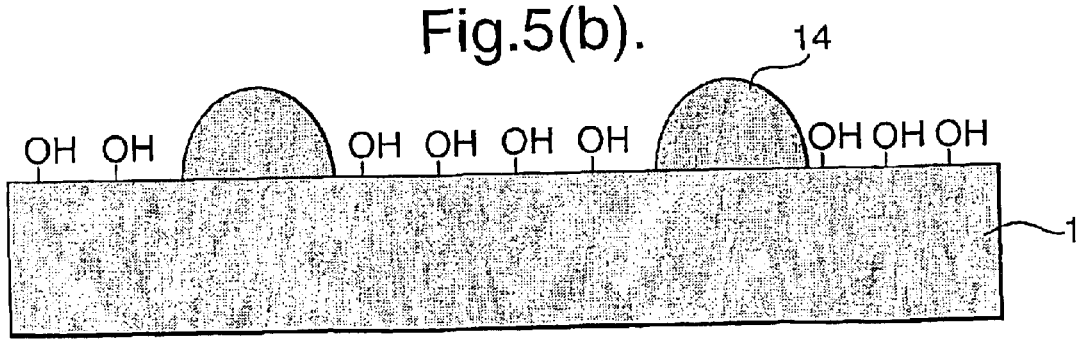

In order to etch the surface region of the first pre-patterning material, a solvent for dissolving the first material, diluted with other solvents that do not dissolve the first material, can be used as the etchant. Such a diluted solvent dissolves the first material slowly, so it is possible to etch only the surface region of the ridge 14, thereby removing the hydroxyl groups, as shown in FIG. 5(b). When polystyrene is used as the first pre-patterning material, aromatic and/or chlorinated hydrocarbons diluted by alcohols or aliphatic hydrocarbons can be used as the etchant. Toluene diluted by isopropanol is a typical example of such an etchant.

In contrast, the substrate 1 is not dissolved in an etchant comprising such a diluted solvent and the hydroxyl groups are therefore retained on the surface of the substrate 1, as shown in FIG. 5(b). The surface of the substrate 1 thus remains hydrophilic. As a result, the pattern of contrasting wettability on the oxygen plasma etched substrate 1 can be recovered after slight etching with such a diluted solvent. Thus, self-alignment of the second target material with the first pre-patterning material can be achieved after this treatment.

In general, however, non-polar materials do not adhere or stick to hydrophilic surfaces very well. This has the result that a first pre-patterning material comprising a non-polar polymer may be lifted off the hydrophilic surface of the substrate 1 during this slight etching with a diluted solvent. In order to improve the adhesive characteristics of the first pre-patterning material with respect to the surface of the substrate 1, primers can be used to change the surface properties of the substrate 1 from hydrophilic to hydrophobic. Hexamethyldisilazane (HMDS) is a typical primer suitable for this purpose. For example, the substrate 1 can be pre-treated, prior to deposition of the first material, using HMDS in vapour or liquid form at 70 to 140° C. The surface of the pre-treated substrate 1 is terminated with hexamethyl groups, which provide hydrophobic properties. Good adhesion of a non-polar first material on such a pre-treated substrate 1 can therefore be obtained.

An additional, advantageous effect of this pre-treatment is that a narrower ridge 14 of the first material can be obtained, since the contact angle of the solution of the first material with the substrate 1 is reduced. Moreover, hexamethyl groups on the surface of the pre-treated substrate 1 are easily removed by oxygen plasma etching, discussed above. Thus, the original hydrophilic surface properties of the untreated substrate 1 are recovered or improved by oxygen plasma etching so the pattern of contrasting wettability between the substrate 1 and the ridge 14 can still be obtained by slight etching with a diluted solvent.

An alternative method for recovering the wettability contrast after dry etching is to expose the oxygen plasma etched substrate 1 to a vapour of a solvent for dissolving the first pre-patterning material. The solvent vapour is absorbed in the pre-patterning material and allows the material to reorient into a more stable, hydrophobic form. Due to this reorientation, hydroxyl groups at the surface of the ridge 14 are replaced by the first material, which is more stable. As a result, the surface of the ridge 14 recovers its original hydrophobic properties and the surface of the substrate 1 retains its hydrophilic state. This exposure method uses a vapour phase and is therefore a dry process. It is therefore unnecessary to dip the substrate 1 into a liquid, which is time-consuming, dirty and expensive. When polystyrene is used for the first pre-patterning material for example, aromatic and/or chlorinated hydrocarbons can be used for the solvent vapour. Toluene or xylene is a typical aromatic hydrocarbon solvent.

Figure 6:
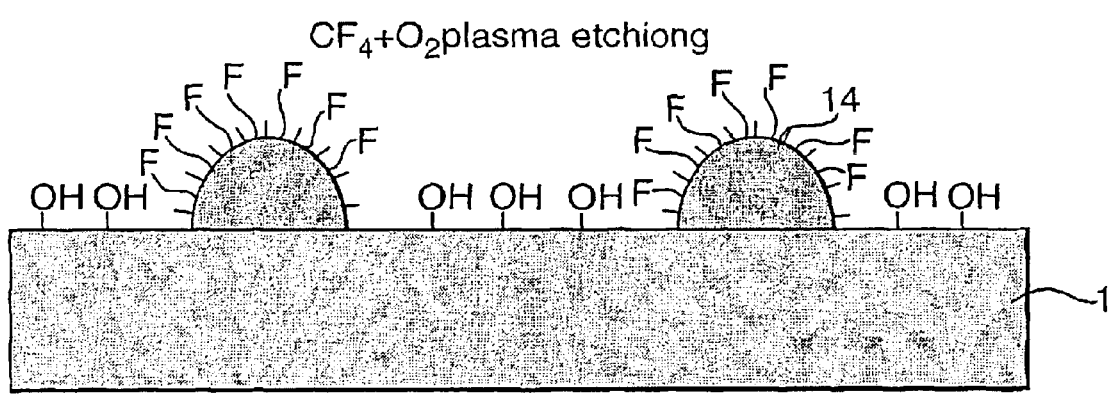
FIG. 6 also shows etching of a substrate in accordance the present invention.

As a further alternative, plasma etching with a mixture of fluorinated carbons and another gas can be used and has been found to be an especially effective method for achieving a high contrast in wettability. When an inorganic substrate 1 having an organic pre-patterning material, ridge 14, thereon is plasma etched using a mixture of fluorinated carbons and oxygen, the surface of organic pre-patterning material is fluorinated since hydrogen atoms binding to carbon atoms therein are replaced by fluorine, as shown in FIG. 6(*a*). This fluorinated surface is non-wetting with respect to both polar solutions and non-polar solutions. On the other hand, as shown in FIG. 6(*a*), the surface of the inorganic substrate 1 is terminated by hydroxyl groups due to the effect of oxygen plasma. The surface of the substrate 1 is therefore wetting, especially with respect to polar solutions.

In contrast, when an inorganic substrate 1 with a ridge 14 of organic pre-patterning material thereon is etched with a mixture of fluorinated carbons and inert gases (Ar, $N_2$), the surface of the ridge 14 is fluorinated, while the surface of the substrate 1 is maintained. This provides a good contrast in wettability, especially with respect to non-polar solutions.

Figure 7A:
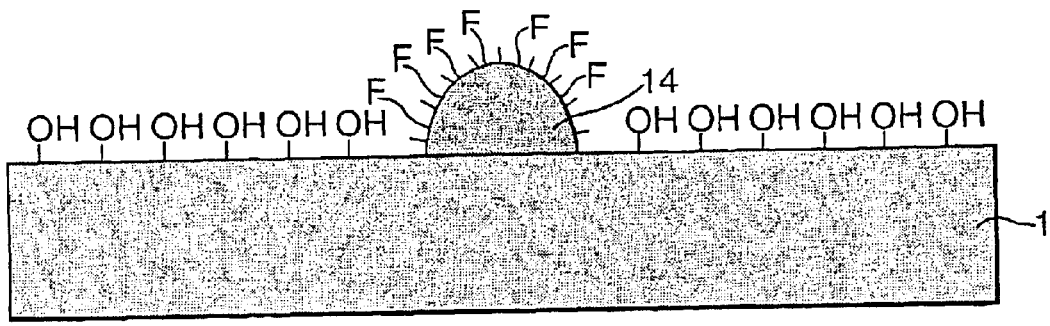
FIG. 7 illustrates deposition of a droplet of a solution on the substrate shown in FIG. 6.
Figure 7B:
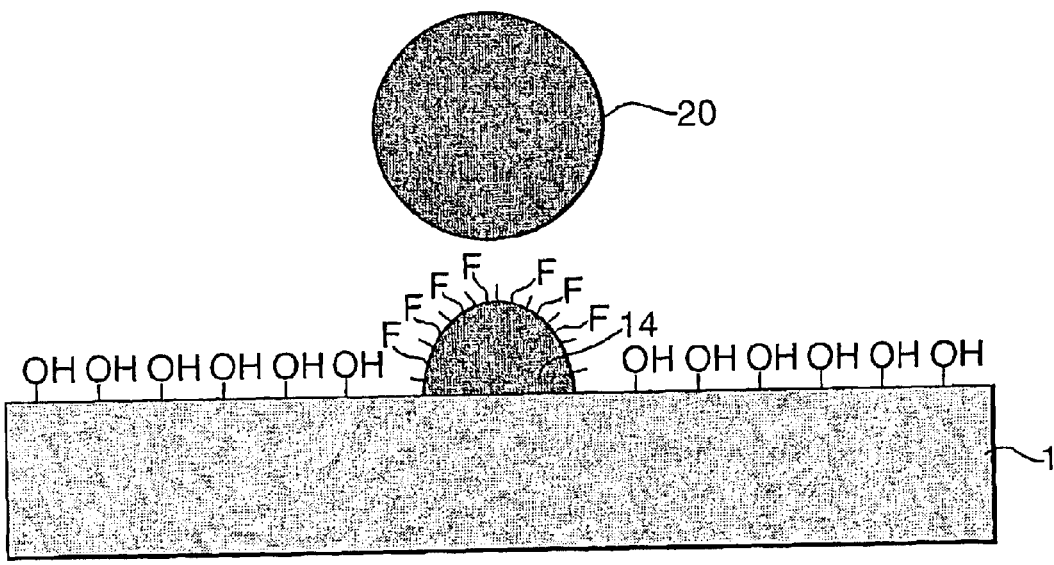
Figure 7C:
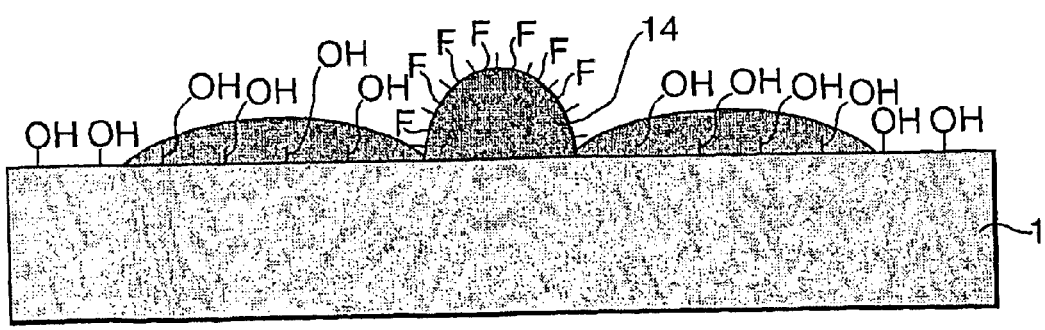
Figure 8A:
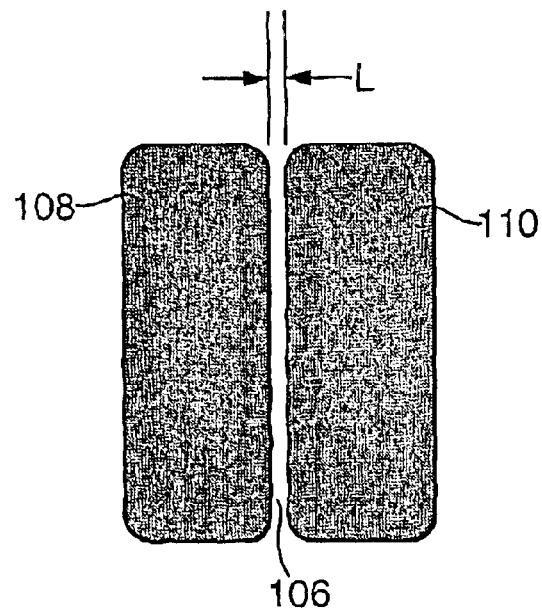
FIG. 8 shows a prior art pre-patterned contrast in wettability.
Figure 8B:
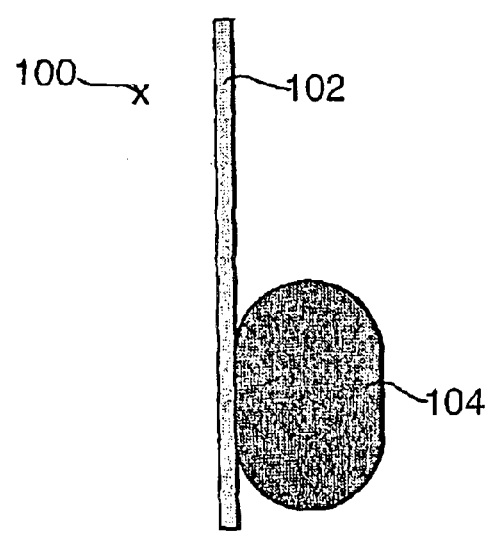

In order to pattern source and drain electrodes in TFTs, the solution of the second target material, for example PEDOT water-based solution, may be deposited twice, once for each of the source and drain. However, the fluorinated surface of the ridge 14 shown in FIGS. 6 and 7(*a*) is sufficiently non-wetting that droplets 20 of PEDOT solution can be deposited only once, directly onto the ridge 14, as shown in FIG. 7(*b*). The solution is repelled by the ridge 14 and is divided by the ridge to lie on two portions on the hydrophilic surface of the substrate 1, one on either side of the ridge 14, as shown in FIG. 7(*c*). Deposition of this second target material only occurs on the substrate 1, without the formation of a bridge of the second target material over ridge 14, which would cause a short circuit between the two portions. Thus, the second target material can be very easily deposited with high reliability.

Figure 9:
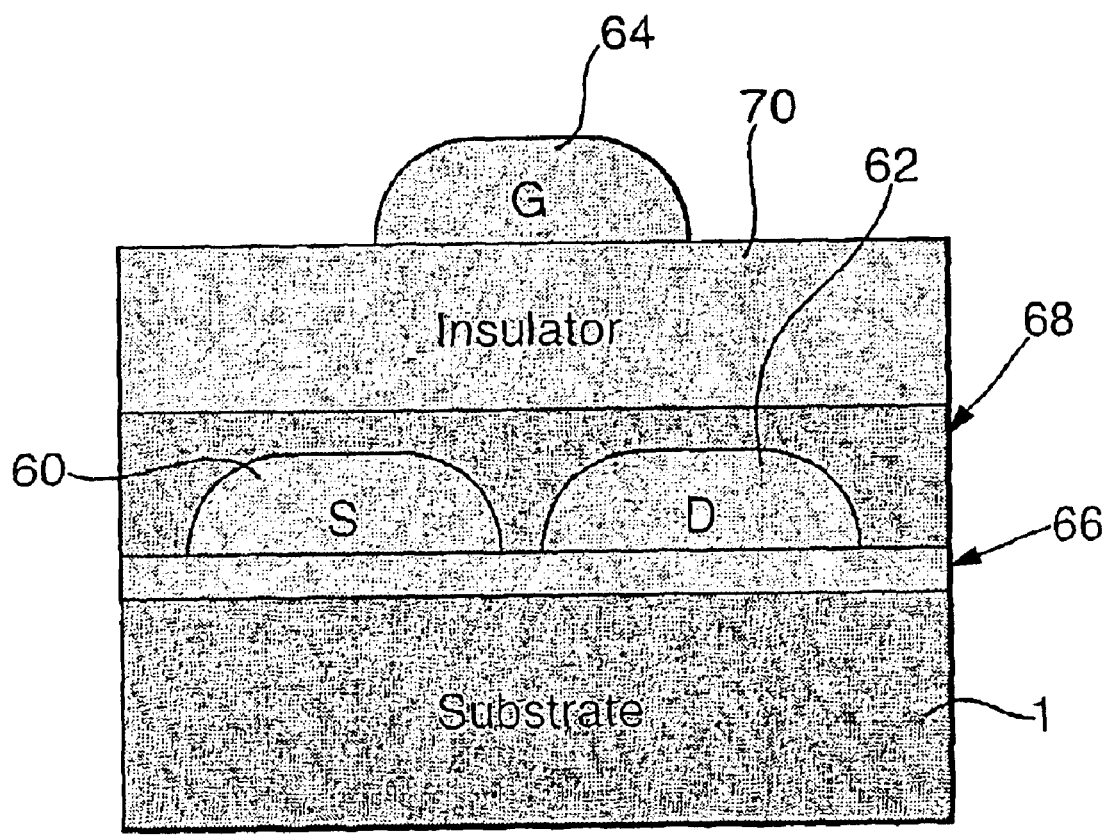
FIG. 9 shows a thin film transistor fabricated in accordance with the present invention.

A TFT can be fabricated using the method of the present invention described above. The structure of a printable TFT is shown in FIG. 9, in which a glass or plastic substrate 1 may be used. Flexible devices may be obtained using a plastic substrate. Polyimide, polyethylene naphthalate, polyphenylene sulfide, polyetherkiton or polyethersulfone are all suitable for use as a plastic substrate in terms of resistance to heat and solvents during later processing to fabricate the device using conventional techniques. When the temperature of such conventional processing is less than 100° C., less expensive materials such as polyethylene terephthalate, polymethyl methacrylate or polycarbonate can be used. On the substrate, an alignment layer 66 may optionally be formed in the event that alignment of molecules or polymer chains is required in the semiconductor. Rubbed polyimide is a typical material commonly used for such an alignment layer. Such rubbed polyimide layers may be obtained by rubbing cured polyimide layers with textured fabric in a direction parallel to a channel.

On this alignment layer 66, the first pre-patterning material is deposited in the form of strips 16 by an inkjet print head, as shown in FIG. 10(*a*). These pre-pattern strips 16 are non-wetting with respect to the solution of the second target material. In this example, a PEDOT water-based solution is used as the solution of the second material, so the first pre-patterning material is hydrophobic.

Many kinds of hydrocarbon or fluorinated carbon are suitable for this purpose. Among these, non-polar polymers are appropriate materials with respect to the formation of uniform films. Polystyrene is one such non-polar polymer and a solution of 0.1–4% polystyrene in toluene or xylene can be used as the solution of the first pre-patterning material, for example. The dried deposited strips 16 have a thin thickness in the centre region and a ridge around the edge. As discussed above, the cross-sectional profile depends on the drying conditions. Since narrow and high ridges can be obtained by quick drying, a stream of $N_2$ is passed over the substrate 1, as shown in FIG. 10(*a*) and/or the substrate 1 is heated.

In order to etch the thin film at the centre region, the sample is etched using oxygen plasma. Since the film is thin, in the range 5 to 20 nm, the etching time is short. For example, the etching time for a 20 nm thick film is about 5 minutes where the oxygen pressure is 2.5 mbar and the RF power density is 4000 W/m². The etched thickness (depth) is approximately proportional to the product of the etching time and the RF power density. The minimum etched thickness required is the thickness of the film at the centre region and with further etching the width of the ridge can be narrowed. This further etching has reasonably good reproducibility due to the large difference in thickness of the thin film at the centre and the ridge: the thickness of ridge can be controlled to be generally larger than 300 run, even when the thickness of the centre deposition is smaller than 20 nm. This large contrast in thickness makes it possible to accurately control the width of the ridge. With minimum etching to remove the thin film in the centre region, a ridge as narrow as 10 to 30 μm is obtainable, and with further etching 3 to 15 μm width ridges can be easily achieved over the whole substrate.

Figure 10A:
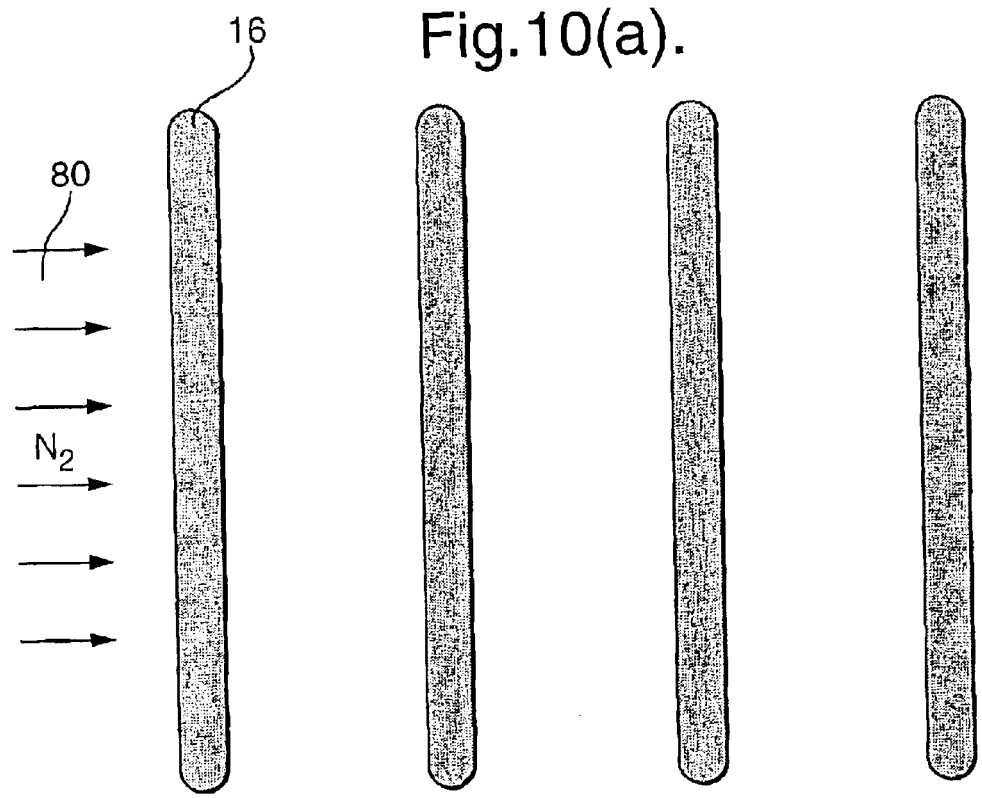
FIG. 10 shows a method of fabricating a plurality of thin film transistors in accordance with the present invention.
Figure 10B:
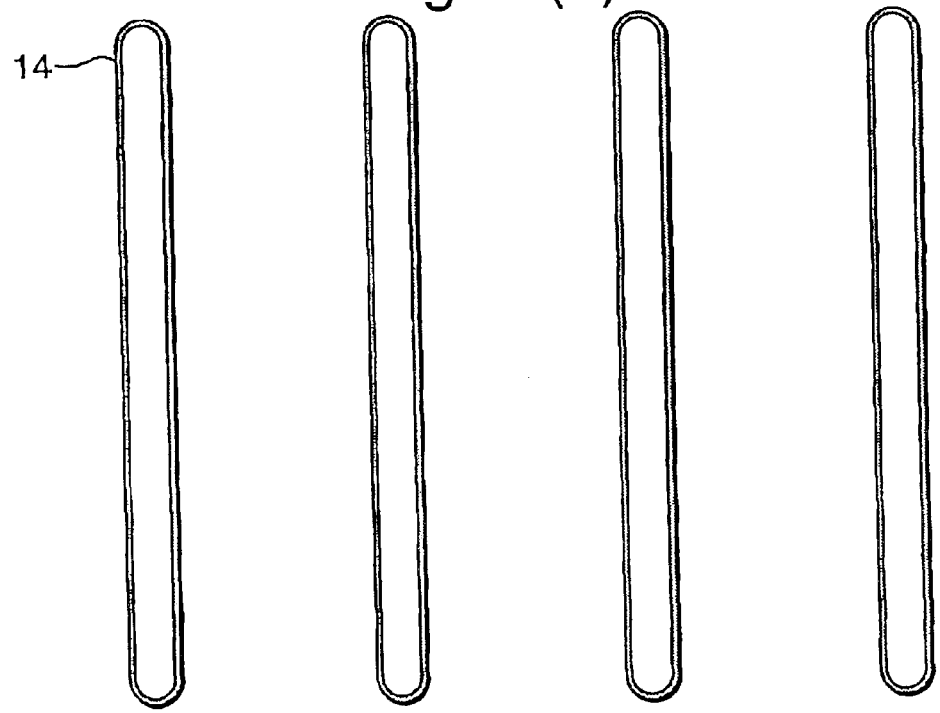

At this stage, the surface of both the substrate 1 and the ridges are hydrophilic, so the wettability contrast needs to be recovered by selective etching or reorientation of the ridges of first pre-patterning material. A mixture of xylene and isopropanol, in the ratio 5:95 for example, can be used for the selective etching. This mixture does not dissolve the rubbed polyimide alignment layer 66, but removes the surface region of the ridges of pre-patterning material. After the selective etching process, elongated ringed ridges 14 of the pre-patterning material are obtained, as shown in FIG. 10(b).

Figure 10C:
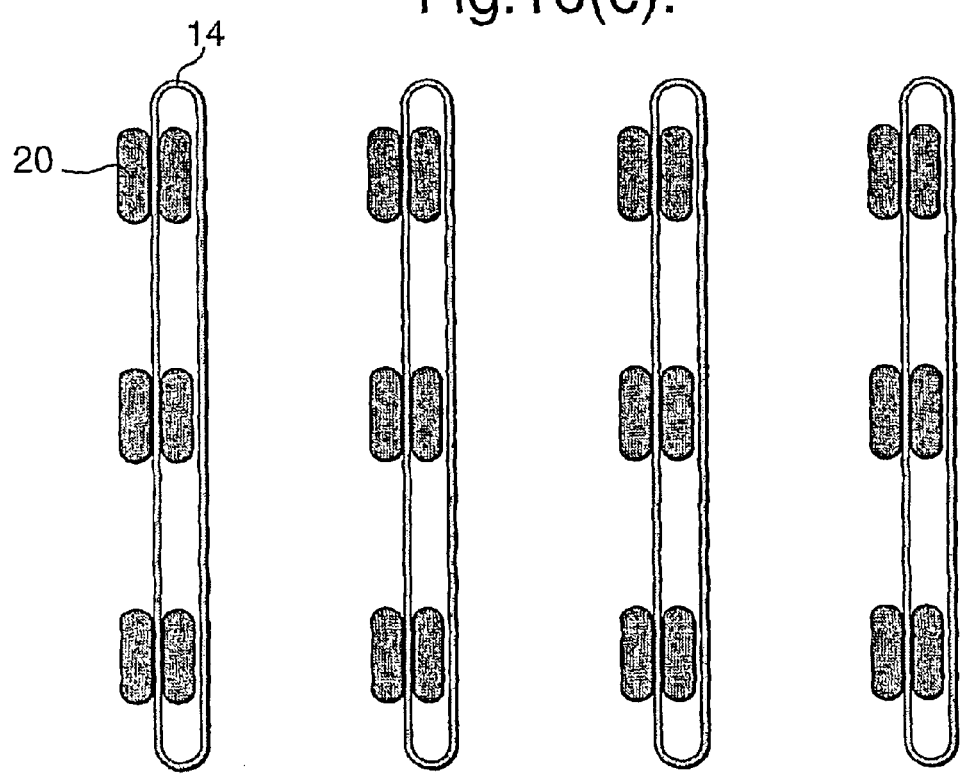

Each elongated ringed ridge may be used to fabricate more than one TFT. As illustrated in FIG. 10(c), droplets 20 of the second target material, forming the source 60 and drain 62 of the TFT (see FIG. 9), are deposited so as to form a plurality of transistors along one ridge. PEDOT waterbased solution is used as the second target material. This wets the surface of the rubbed polyimide alignment layer 66, but it is repelled by the polystyrene pre-patterning ridge 14. These properties cause a narrow gap to be formed in the second target material, along the ridge 14.

Figure 10D:
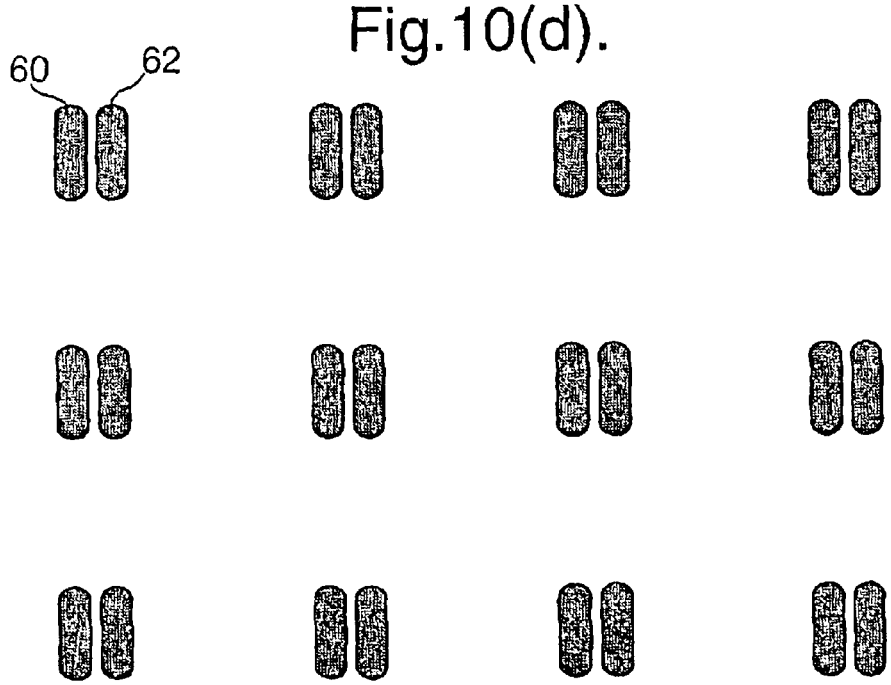

This step can be followed by removal of the ridge 14 with a solvent for the first material, as shown in FIG. 10(d). A semiconductor layer 68 and an insulating layer 70 are then deposited on the source 60 and drain 62 electrodes in order to fabricate the structure shown in FIG. 9. Several techniques for depositing these layers are known, including evaporation, spin-coating, screen-printing and inkjet-printing. Gate electrodes 64 and interconnections 90 are then deposited on the insulating layer 70, preferably by ejection of a PEDOT water-based solution by an inkjet print head.

Alignment of the gate electrode 64 with the channel is required, so an inkjet head and a substrate holder should be positioned so as to achieve this alignment. Since inkjet printing is a non-contact printing technique, such positioning is relatively easy and accurate compared to other contact printing techniques.

Figure 10E:
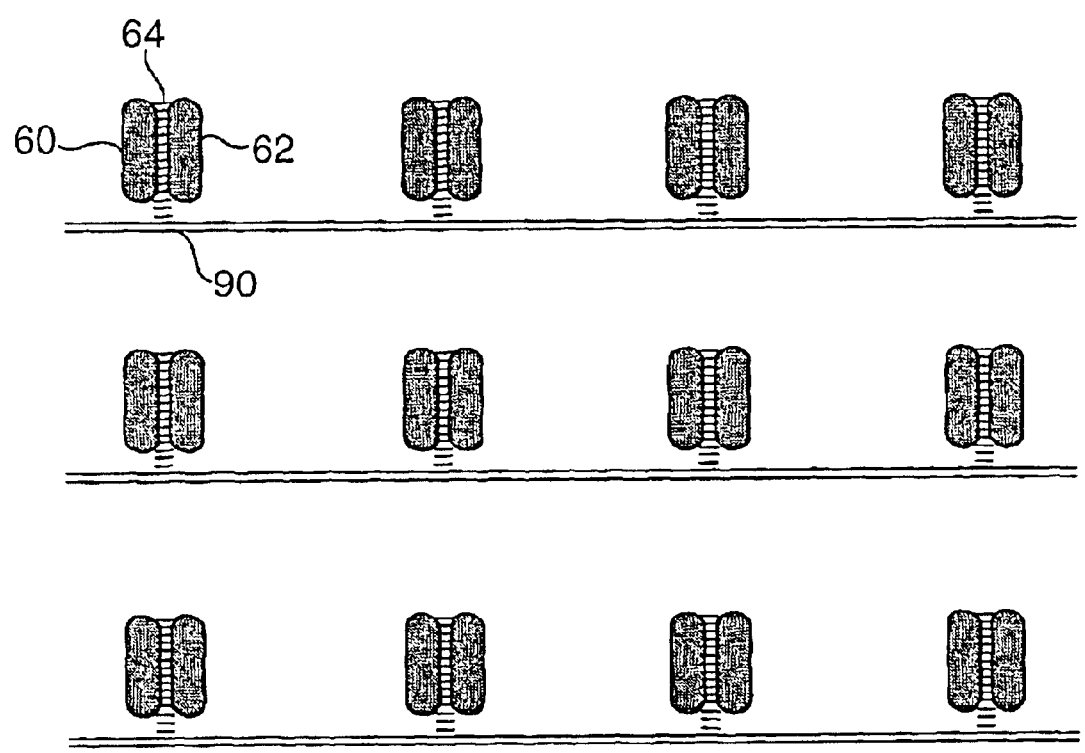

Thus, a TFT array such as that shown in FIG. 10(e) can be obtained. Even though these TFTs have a short channel (less than 30 μm), they are achieved simply using an inkjet printing technique. The method of the present invention does not require photolithography for the pre-patterning and allows production of TFT arrays with a very low manufacturing cost. The method of the present invention also enables the fabrication of very large, flexible devices, which can only be obtained using conventional photolithographic techniques with considerable difficulty.

A method of patterning a substrate and/or a method of forming a thin film transistor according to the present invention can be preferably applied to manufacture of an electro-optical device, a semiconductor device and other electronic devices. In other words, a TFT array manufactured by the method according to the present invention can be preferably used in some kinds of electro-optical devices. The electro-optical devices preferably include a liquid crystal device, an organic electroluminescent device, an inorganic electroluminescent device, a field-emission device (FED), a plasma device, an electrophoretic device, and other display devices. These devices can be preferably applied to a display apparatus. In particular, such a TFT array can be more preferably applied to pixel circuits and/or driver circuits formed in an active matrix substrate used in the above display devices.

Figure 11:
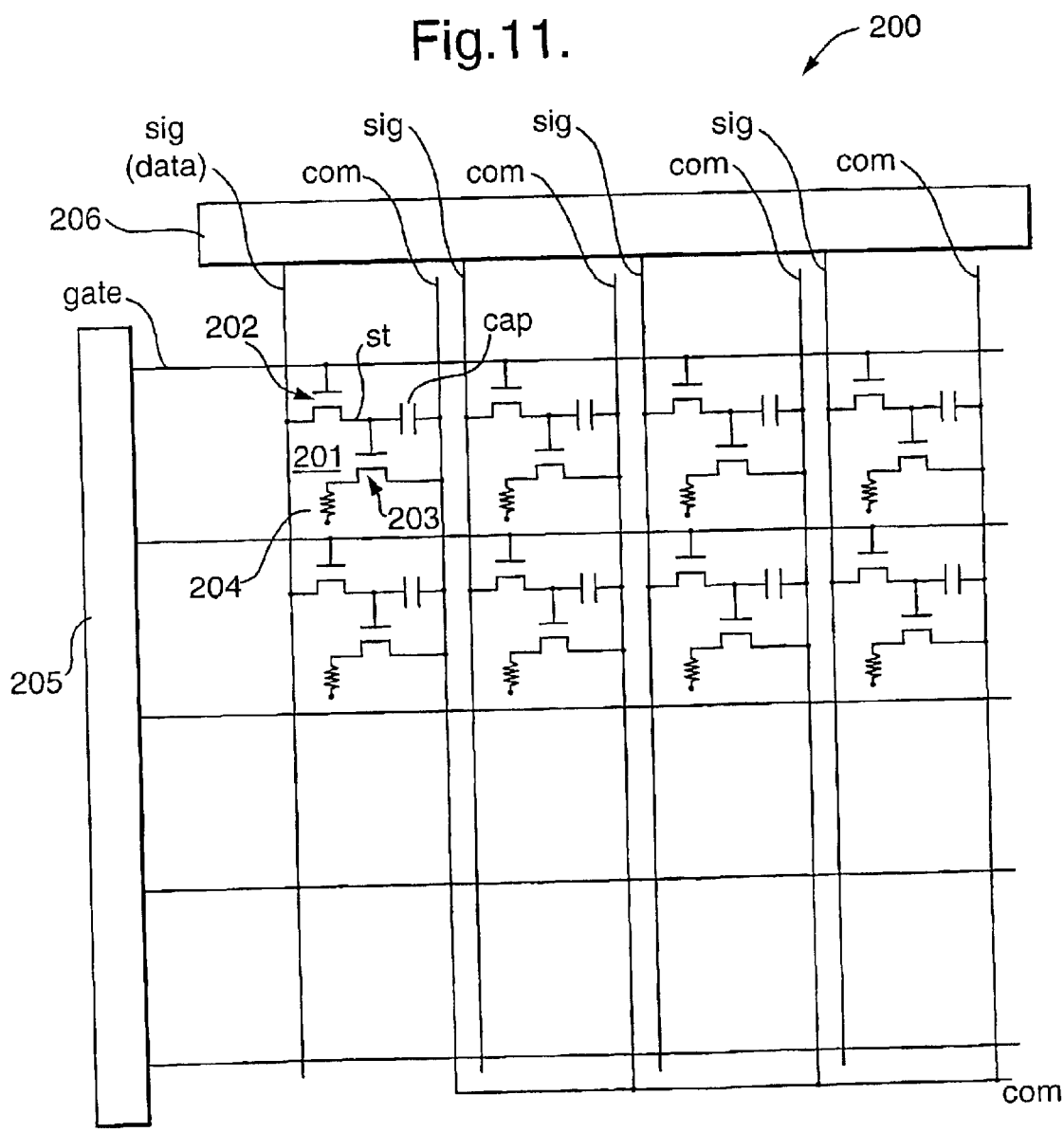
FIG. 11 shows a block diagram of an electro-optical device.

FIG. 11 is a block diagram illustrating an active matrix type display device (or apparatus) incorporating electro-optical elements such as organic electroluminescent elements as a preferred example of the electro-optical devices. In the display device 200 shown in this figure, a plurality of scanning lines "gate", a plurality of data lines "sig" extending in a direction that intersects the direction in which the scanning lines "gate" extend, a plurality of common power supply lines "corn" extending substantially parallel to the data lines "sig", and a plurality of pixels 201 located at the intersections of the data lines "sig" and the scanning lines "gate" which are formed above a substrate.

Each pixel 201 comprises a first TFT 202, to which a scanning signal is supplied to the gate electrode through the scanning gate, a holding capacitor "cap" which holds an image signal supplied from the data line "sig" via the first TFT 202, a second TFT 203 in which the image signal held by the holding capacitor "cap" is supplied to the gate electrode (a second gate electrode), and an electro-optical element 204 such as an electroluminescent element (indicated as a resistance) into which the driving current flows from the common power supply line "com" when the element 204 is electrically connected to the common power supply line "corn" through the second TFT 203. The scanning lines "gate" are connected to a first driver circuit 205 and the data lines "sig" are connected to a second driver circuit 206. At least one of the first circuit 205 and the second circuit 205 can be preferably formed above the substrate above which the first TFTs 202 and the second TFTs 203 are formed. The TFT array(s) manufactured by the methods according to the present invention can be preferably applied to at least one of an array of the first TFTs 202 and the second TFTs 203, the first driver circuit 205, and the second driver circuit 206.

The present invention may therefore be used to fabricate displays and other devices which are to be incorporated in many types of equipment such as mobile displays e.g. mobile phones, laptop personal computers, DVD players, cameras, field equipment; portable displays such as desktop computers, CCTV or photo albums; instrument panels such as vehicle or aircraft instrument panels; or industrial displays such as control room equipment displays. In other words, an electro-optical device or display to which the TFT array(s) manufactured by the methods according to the present invention is (are) applied as noted above can be incorporated in the many types of equipment, as exemplified above.

Various electronic apparatuses using electro-optical display devices fabricated in accordance with the present invention will now be described.

<1: Mobile Computer>

An example in which the display device fabricated in accordance with one of the above embodiments is applied to a mobile personal computer will now be described.

FIG. 12 is an isometric view illustrating the configuration of this personal computer. In the drawing, the personal computer 1100 is provided with a body 1104 including a keyboard 1102 and a display unit 1106. The display unit 1106 is implemented using a display panel fabricated according to the present invention, as described above.

<2: Portable Phone>

Next, an example in which the display device is applied to a display section of a portable phone will be described. FIG. 13 is an isometric view illustrating the configuration of the portable phone. In the drawing, the portable phone 1200 is provided with a plurality of operation keys 1202, an earpiece 1204, a mouthpiece 1206, and a display panel 100. This display panel 100 is implemented using a display device according to the present invention, as described above.

<3: Digital Still Camera>

Next, a digital still camera using an OEL display device as a finder will be described. FIG. 14 is an isometric view illustrating the configuration of the digital still camera and the connection to external devices in brief.

Typical cameras use sensitized films having light sensitive coatings and record optical images of objects by causing a chemical change in the light sensitive coatings, whereas the digital still camera 1300 generates imaging signals from the optical image of an object by photoelectric conversion using, for example, a charge coupled device (CCD). The digital still camera 1300 is provided with an OEL element 100 at the back face of a case 1302 to perform display based on the imaging signals from the CCD. Thus, the display panel 100 functions as a finder for displaying the object. A photo acceptance unit 1304 including optical lenses and the CCD is provided at the front side (behind in the drawing) of the case 1302.

When a cameraman determines the object image displayed in the OEL element panel 100 and releases the shutter, the image signals from the CCD are transmitted and stored to memories in a circuit board 1308. In the digital still camera 1300, video signal output terminals 1312 and input/output terminals 1314 for data communication are provided on a side of the case 1302. As shown in the drawing, a television monitor 1430 and a personal computer 1440 are connected to the video signal terminals 1312 and the input/output terminals 1314, respectively, if necessary. The imaging signals stored in the memories of the circuit board 1308 are output to the television monitor 1430 and the personal computer 1440, by a given operation.

Examples of electronic apparatuses, other than the personal computer shown in FIG. 12, the portable phone shown in FIG. 13, and the digital still camera shown in FIG. 14, include OEL element television sets, view-finder-type and monitoring-type video tape recorders, car navigation systems, pagers, electronic notebooks, portable calculators, word processors, workstations, TV telephones, point-of-sales system (POS) terminals, and devices provided with touch panels. Of course, the above OEL device can be applied not only to display sections of these electronic apparatuses but also to any other form of apparatus which incorporates a display section.

Furthermore, the display devices fabricated in accordance with the present invention are also suitable for a screen-type large area television which is very thin, flexible and light in weight. It is possible therefore to paste or hang such large area television on a wall. The flexible television can, if required, be conveniently rolled up when it is not used.

The aforegoing description has been given by way of example only and it will be appreciated by a person skilled in the art that modifications can be made without departing from the scope of the present invention. For example, a person skilled in the art will appreciate that a wide variety and various combinations of substrates, pre-patterning materials and target materials, individually and together, can be selected. In addition, it will be appreciated that a variety of shapes, sizes and patterns of pre-patterning material can be used. It will, for example, be further appreciated that selected lines of a second target material, bounded on either side, can be provided either using a single line of a first pre-patterning material, which is wetting with respect to the second target material, or using two lines of a first pre-patterning material, which is non-wetting with respect to the second target material.

What is claimed is:

1. A method of patterning a substrate, the method comprising:
   depositing a first material in solution on the substrate, wherein the solution of the first material is selected such that a profile of the first material dried on the substrate includes a ridge;
   etching for removing portions of the first material such that the ridge of the first material remains on the substrate; and
   depositing a second material in solution on or adjacent the ridge of the first material.

2. A method according to claim 1, wherein the wetting characteristic of the etched ridge of the first material with respect to the solution of the second material is different to that of the substrate.

3. A method according to claim 1, wherein the wetting characteristic of the first material with respect to the solution of the second material is different to that of the substrate.

4. A method according to claim 1, wherein said etching is dry etching using an inert gas.

5. A method according to claim 1, wherein said etching further comprises adjusting the wetting characteristics of the first material and of the substrate with respect to the solution of the second material.

6. A method according to claim 5, wherein said etching comprises a first step of etching for removing portions of the first material, thereby adjusting the wetting characteristics of the first material and the substrate, and a second step of adjusting the wetting characteristics of the first material.

7. A method according to claim 6, wherein the first step of etching comprises dry etching.

8. A method according to claim 7, wherein oxygen plasma is used for the first step of etching.

9. A method according to claim 6, further comprising, before said depositing the first material in solution, improving the wetting characteristics of the substrate with respect to the first material.

10. A method according to claim 6, wherein a diluted solvent for the first material is used for the second step.

11. A method according to claim 6, wherein vapour of a solvent for the first material is used for the second step.

12. A method according to claim 10, wherein the first material comprises a non-polar polymer and the solvent comprises aromatic and/or chlorinated hydrocarbons.

13. A method according to claim 12 wherein the solvent comprises toluene and/or xylene.

14. A method according to claim 12, wherein alcohols and/or aliphatic hydrocarbons are also used for the second step.

15. A method according to claim 14, wherein said alcohols and/or aliphatic hydrocarbons comprise isapropanol.

16. A method according to claim 5, wherein said etching comprises plasma etching using a mixture of fluorinated carbon atoms and another gas.

17. A method according to claim 16, wherein said another gas comprises oxygen.

18. A method according to claim 16, wherein said another gas comprises an inert gas.

19. A method according to claim 1, wherein the substrate and the solution of the first material are selected such that said ridge is formed along the perimeter of the deposited first material.

20. A method according to claim 19, wherein the perimeter includes at least one substantially straight portion.

21. A method according to claim 20, wherein the perimeter comprises an elongated oval or circle having two substantially straight portions.

22. A method according to claim 20, wherein the second material is deposited on or adjacent said at least one straight portion only.

23. A method according to claim 21, wherein the second material is deposited on or adjacent both the substantially straight portions.

24. A method according to claim 1 wherein the concentration of the first material in solution is selectively controlled so as to selectively control the profile of the first material dried on the substrate.

25. A method according to claim 1 comprising selecting the viscosity for a solvent for the first material so as to selectively control the profile of the first material dried on the substrate.

26. A method according to claim 25 wherein the viscosity is selected to be less than about 10 cps and preferably less than 4 cps.

27. A method according to claim 25 comprising selecting the volatility of the solvent so as to selectively control the profile of the first material dried on the substrate.

28. A method according to claim 27 wherein the solvent is selected to have a boiling point of less than about 160° C. and preferably less than about 120° C.

29. A method according to claim 1, further comprising, after said depositing the first material in solution and before said etching, passing a stream of gas over the substrate for drying the solution of the first material.

30. A method according to claim 29 wherein the stream of gas is provided as a unidirectional stream.

31. A method according to claim 29 wherein the stream of gas is heated.

32. A method according to claim 1, further comprising, after said depositing the first material in solution and before said etching, heating the substrate for drying the solution of the first material.

33. A method according to claim 32 wherein the substrate is heated to a temperature within a range of from about 40° C. to about 150° C.

34. A method according to claim 1, wherein, after etching, the ridge is more wettable than the substrate with respect to the solution of the second material such that the second material dries on the ridge.

35. A method according to claim 1, wherein, after etching, the substrate is more wettable than the ridge with respect to the solution of the second material, such that the second material dries substantially on the substrate only, adjacent the ridge.

36. A method according to claim 35, wherein the solution of the second material is deposited adjacent either side of the ridge.

37. A method according to claim 36, wherein the solution of the second material is deposited on the ridge such that the second material dries adjacent either side of the ridge.

38. A method according to claim 35, wherein the solution of the second material is selected such that a profile of the second material dried on the substrate is mesa-shaped.

39. A method according to claim 35, wherein the first material is a non-polar polymer and the solution of the second material is a water-based PEDOT solution.

40. A method according to claim 39 wherein the non-polar polymer is selected to have a molecular weight of less than about 100,000.

41. A method according to claim 39, wherein the first material comprises aromatic and/or alkyl groups and does not comprise hydroxyl, diazo or any acid group.

42. A method according to claim 41, wherein the first material is polystyrene or polyethylene.

43. A method according to claim 35, further comprising a step of removing the ridge from the substrate.

44. A method of forming a thin film transistor comprising a method according to claim 43, wherein the second material forms a source and a drain with a gap therebetween, the method further comprising:
   depositing a semiconductor layer over the second material and the substrate;
   depositing an insulating layer over the semiconductor layer; and
   providing a gate electrode over the gap.

45. A method according to claim 44, wherein the substrate comprises an alignment layer on which the first material is deposited.

46. A method according to claim 45, wherein the alignment layer is brushed polyimide.

47. A method according to claim 44, wherein at least one of the semiconductor layer, the insulating layer and the gate electrode is deposited using an inkjet print head.

48. A method according to claim 47, wherein the inkjet print head is moved relative to the substrate for depositing said at least one of the semiconductor layer, the insulating layer and the gate electrode.

49. A method according to claim 1, wherein at least one of the solution of the first material and the solution of the second material is deposited using an inkjet print head.

50. A method according to claim 49, wherein the inkjet print head is moved relative to the substrate for depositing said at least one of the solution of the first material and the solution of the second material.

51. A method according to claim 1, wherein the substrate is selected to comprise glass or plastic.

52. A method according to claim 1, wherein the substrate is selected to comprise a flexible material.

* * * * *

UNITED STATES PATENT AND TRADEMARK OFFICE
CERTIFICATE OF CORRECTION

PATENT NO. : 6,838,361 B2
DATED : January 4, 2005
INVENTOR(S) : Takeo Kawase

It is certified that error appears in the above-identified patent and that said Letters Patent is hereby corrected as shown below:

<u>Title page,</u>
Item [75], Inventor, should read:
-- Takeo KAWASE --.

Signed and Sealed this

Seventh Day of February, 2006

JON W. DUDAS
*Director of the United States Patent and Trademark Office*